United States Patent
Bao

(10) Patent No.: US 9,124,215 B2
(45) Date of Patent: Sep. 1, 2015

(54) MIXER CIRCUIT

(75) Inventor: Mingquan Bao, Vastra Frolunda (SE)

(73) Assignee: TELEFONAKTIEBOLAGET L M ERICSSON (PUBL), Stockholm (SE)

( * ) Notice: Subject to any disclaimer, the term of this patent is extended or adjusted under 35 U.S.C. 154(b) by 55 days.

(21) Appl. No.: 14/110,111

(22) PCT Filed: Apr. 4, 2011

(86) PCT No.: PCT/EP2011/055180
§ 371 (c)(1),
(2), (4) Date: Oct. 4, 2013

(87) PCT Pub. No.: WO2012/136240
PCT Pub. Date: Oct. 11, 2012

(65) Prior Publication Data
US 2014/0030992 A1    Jan. 30, 2014

(51) Int. Cl.
| H01Q 11/12 | (2006.01) |
| H04B 1/04 | (2006.01) |
| H03D 7/14 | (2006.01) |
| H03D 7/18 | (2006.01) |

(52) U.S. Cl.
CPC ........... *H03D 7/1425* (2013.01); *H03D 7/1433* (2013.01); *H03D 7/1441* (2013.01); *H03D 7/1458* (2013.01); *H03D 7/1491* (2013.01); *H03D 7/18* (2013.01); *H04B 1/04* (2013.01); *H03C 2200/0083* (2013.01); *H03D 2200/009* (2013.01); *H03D 2200/0033* (2013.01); *H03D 2200/0043* (2013.01)

(58) Field of Classification Search
CPC .... H04B 2001/0491; H04B 1/04; H03D 7/00; H03D 7/1441
USPC ............................ 455/118, 120, 126; 327/113
See application file for complete search history.

(56) References Cited

U.S. PATENT DOCUMENTS

| 5,757,298 | A | 5/1998 | Manley et al. |
| 6,054,889 | A | 4/2000 | Kobayashi |
| 6,751,272 | B1 * | 6/2004 | Burns et al. ................... 375/340 |
| 2005/0123066 | A1 * | 6/2005 | Sarca ............................. 375/296 |
| 2005/0213672 | A1 | 9/2005 | Lin et al. |
| 2005/0277389 | A1 | 12/2005 | Friedrich et al. |
| 2007/0049215 | A1 | 3/2007 | Chen et al. |
| 2008/0132195 | A1 * | 6/2008 | Maxim et al. ................. 455/334 |
| 2009/0203347 | A1 * | 8/2009 | Kaczman et al. ............. 455/326 |

OTHER PUBLICATIONS

European communication dated Aug. 1, 2014, issued for corresponding EP application No. 11 713 244.9, 5 pages.

* cited by examiner

*Primary Examiner* — Nhan Le
(74) *Attorney, Agent, or Firm* — Rothwell, Figg, Ernst & Manbeck, P.C.

(57) ABSTRACT

A mixer circuit (200, 300, 800, 900) for mixing a first input signal at a first frequency with a second input signal at a second frequency to an output signal at a third frequency. The mixer circuit (200, 300, 800, 900) comprises a mixing stage (205, 805) with differential input ports (206, 207; 820, 821) for the first input signal and an input port (211, 911) for the second input signal and differential output ports for the output signal, which also serve as output ports for the mixer circuit. The mixer circuit (200, 300, 800, 900) comprises a nonlinear digital to analogue converter (210, 810) which has an input port (211) which is the input port for the second input signal and an output port (212) which is connected to the input port of the mixing stage, and the digital to analogue converter has a nonlinear transfer function.

8 Claims, 7 Drawing Sheets

US 9,124,215 B2

MIXER CIRCUIT

CROSS REFERENCE TO RELATED APPLICATION(S)

This application is a 35 U.S.C. §371 National Phase Entry Application from PCT/EP2011/055180, filed Apr. 4, 2011, designating the United States, the disclosure of which is incorporated herein in its entirety by reference.

TECHNICAL FIELD

The present invention discloses an improved mixer circuit.

BACKGROUND

Mixer circuits are often used in, for example, transmitters and receivers. In, for example, a transmitter, there will often also be comprised an amplifier, usually a power amplifier. A drawback with power amplifiers is that they usually exhibit a transfer function which is non-linear. In order to compensate for such non-linearities in a power amplifier, a transmitter will therefore often comprise a "pre-distortion" circuit, i.e. a circuit which introduces non-linearities which are the inverse of the non-linearities exhibited by the power amplifier, so that the total transfer function of the transmitter is linearized.

A drawback of using pre-distortion circuits is that they are usually costly and have quite a complicated design.

SUMMARY

It is an object of the present invention to obtain a mixer circuit which obviates at least some of the disadvantages of prior art mixer circuits, in particular when it comes to compensating for non-linearities, either in a power amplifier to which the mixer circuit is connected or in the mixer circuit as such.

This object is addressed by the present invention in that it discloses a mixer circuit for mixing a first input signal at a first frequency with a second input signal at a second frequency to an output signal at a third frequency.

The mixer circuit comprises a mixing stage with differential input ports for the first input signal and a first input port for the second input signal as well as differential output ports for the output signal, which also serve as output ports for the mixer circuit.

In addition, the mixer circuit also comprises a digital to analogue converter which has an input port which is the first input port for the second input signal and an output port which is connected to the input port of the mixing stage. In other words, in the mixer circuit, the input port of the digital to analogue converter is used as input port for the second input signal. The digital to analogue converter used in the invention has a nonlinear transfer function.

By means of the invention, as will be shown in the following detailed description, a mixer circuit is obtained in which compensation for nonlinearities in the mixer stage and/or in a component such as a power amplifier to which the mixer circuit is connected is simplified as compared to previously known solutions. In addition, the mixer circuit also has the added advantages of low power consumption and small chip size as compared to previously known solutions.

In embodiments of the mixer circuit, the digital to analogue converter comprises a first and a second group of pairs of serially coupled switches and current sources, where the number of such pairs in the first group corresponds to the number of digital bits in the second input signal. Each switch in the first group is controlled by one of the digital bits in the second input signal, with the switches in the second group being controlled to introduce the nonlinear transfer function in the analogue to digital converter.

In embodiments of the mixer circuit, the digital to analogue converter comprises a first and a second group of emitter coupled pairs of bipolar junction transistors, each of which is serially connected to a current source via their emitters. The number of such pairs of emitter coupled bipolar junction transistors in the first group corresponds to the number of digital bits in the second input signal. The base of one of each transistors in the pairs in the first group is controlled by one of the digital bits in the second input signal and the base of the other transistor in the pair is controlled by the inverse of the same digital bit. The bases of the transistors in the pairs in the second group are controlled respectively by the inverse and non-inverse of one of the digital bits in the second input signal. The transistors in the second group are controlled to introduce the nonlinear transfer function in the analogue to digital converter.

BRIEF DESCRIPTION OF THE DRAWINGS

The invention will be described in more detail in the following, with reference to the appended drawings, in which.

DETAILED DESCRIPTION

Figure 1:
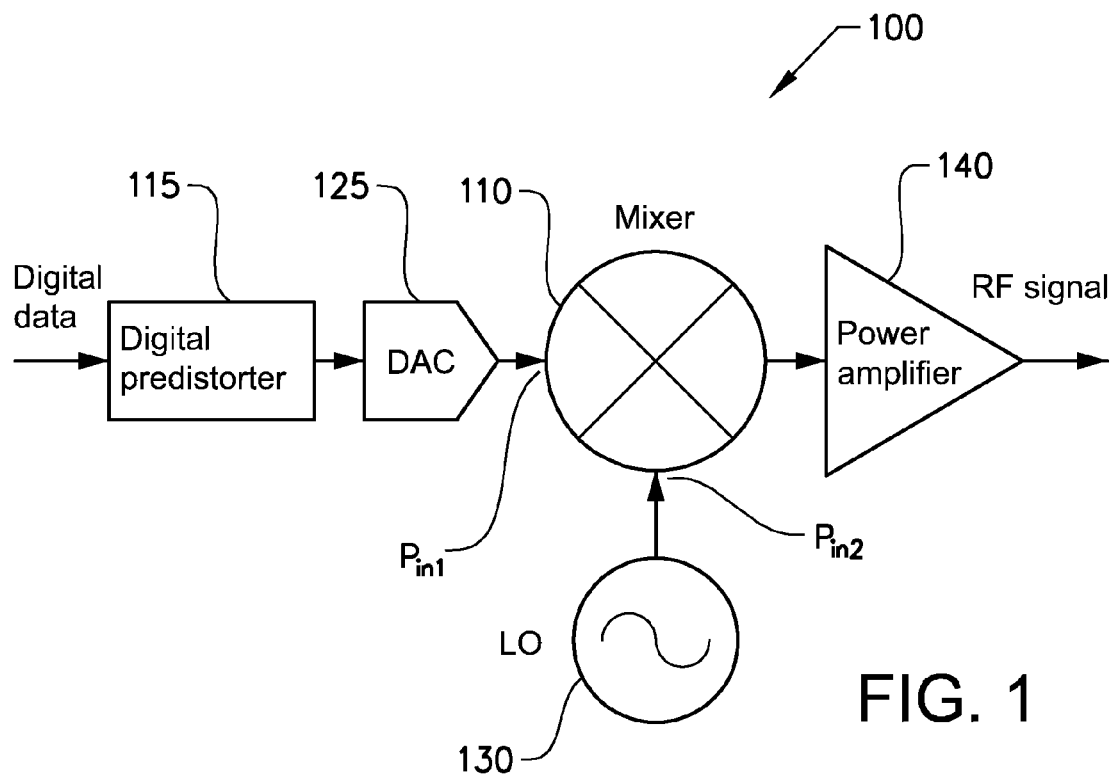
FIG. 1 shows prior art.

Embodiments of the present invention will be described more fully hereinafter with reference to the accompanying drawings, in which embodiments of the invention are shown. The invention may, however, be embodied in many different forms and should not be construed as being limited to the embodiments set forth herein. Like numbers in the drawings refer to like elements throughout.

The terminology used herein is for the purpose of describing particular embodiments only, and is not intended to limit the invention.

FIG. 1 shows a prior art transmitter circuit 100. The transmitter circuit 100 comprises a mixer 110 which has two input ports, indicated as $P_{in1}$ and $P_{in2}$ in FIG. 1. In the circuit 100 there is also comprised a digital pre-distorter 115, and a digital to analogue converter, DAC 125. The digital pre-distorter 115 receives digital baseband data as its input, and feeds its output to the DAC 125, which is connected to $P_{in1}$ of the mixer 110. Thus, one input signal to the transmitter circuit 100 is baseband data which has been digitally pre-distorted and then converted to analogue form.

The other input port of the mixer 110, i.e. $P_{in2}$ is used as input from a second (analogue) signal, in FIG. 1 shown as the input from a Local Oscillator, LO 130. The mixer 110 mixes the two input signals into an output signal at a higher frequency than the frequencies of the two input signals, usually, as shown in FIG. 1, into an RF signal, which is fed to a power amplifier 140.

The reason for the presence of the digital pre-distorter 115 in the transmitter circuit 100 is to "compensate" for non-linearities in the power amplifier 140 and/or in the mixer 110. Thus, in the digital pre-distorter 115 the input signals are distorted "inversely" to distortions which will be introduced by the power amplifier 140 and/or the mixer 110. However, as also pointed out previously in this document, a pre-distortion circuit such as the one 115 is usually costly and has quite a complicated design.

Figure 2:
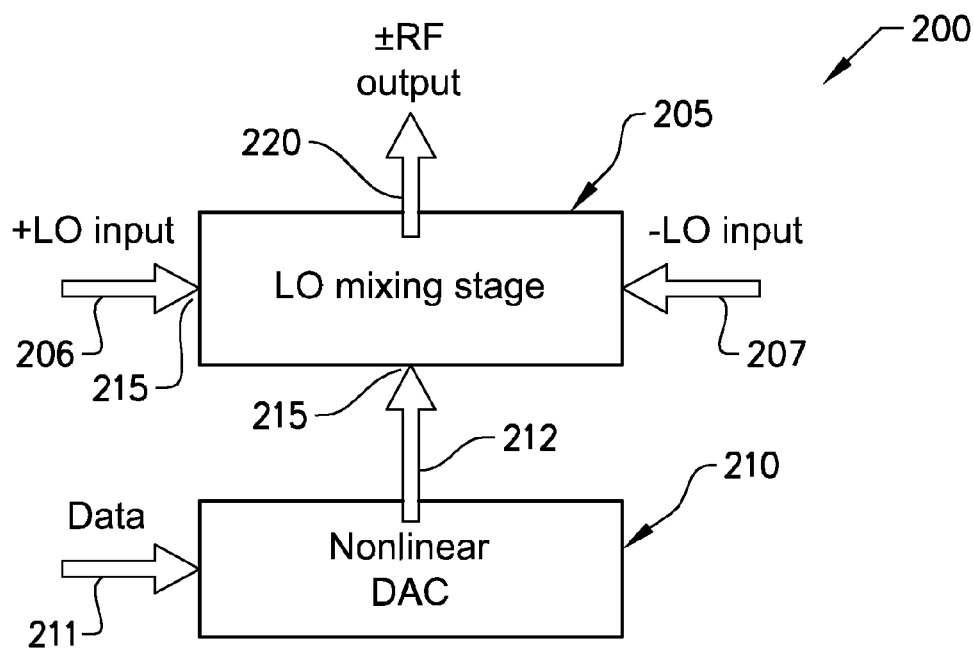
FIG. 2 shows a basic embodiment of the invention.

FIG. 2 shows a basic embodiment of a mixer circuit 200 of the invention: the mixer circuit 200 comprises a mixing stage 205 (as opposed to a complete mixer 110, like the one shown in the embodiment 100 in FIG. 1) and a DAC 210, which has a non-linear transfer function, i.e. a "non-linear DAC". The non-linear DAC 210 receives digital input data at an input port 211, and converts this digital input data to analogue output data, which is output at an output port 212. The output port of the non-linear DAC 210 is connected to an input port 215 of the mixer stage 205. The mixing stage 205 also comprises differential input ports 206, 207 for an LO-signal, i.e. the same LO signal is input at the two differential ports, but with a phase shift of 180 degrees relative to each other.

The mixing stage 205 also comprises differential output ports, symbolically shown as one ± port 220. The differential output ports of the mixing stage 205 also serve as output ports of the entire mixing circuit 200.

The non-linear DAC has a non-linear transfer function, which can either be made to compensate for non-linearities in the mixing stage 205 and/or known non-linearities in other components which are not comprised in the mixer circuit 200, but to which the mixer circuit will be connected, such as, for example, a power amplifier, a PA.

Figure 3:
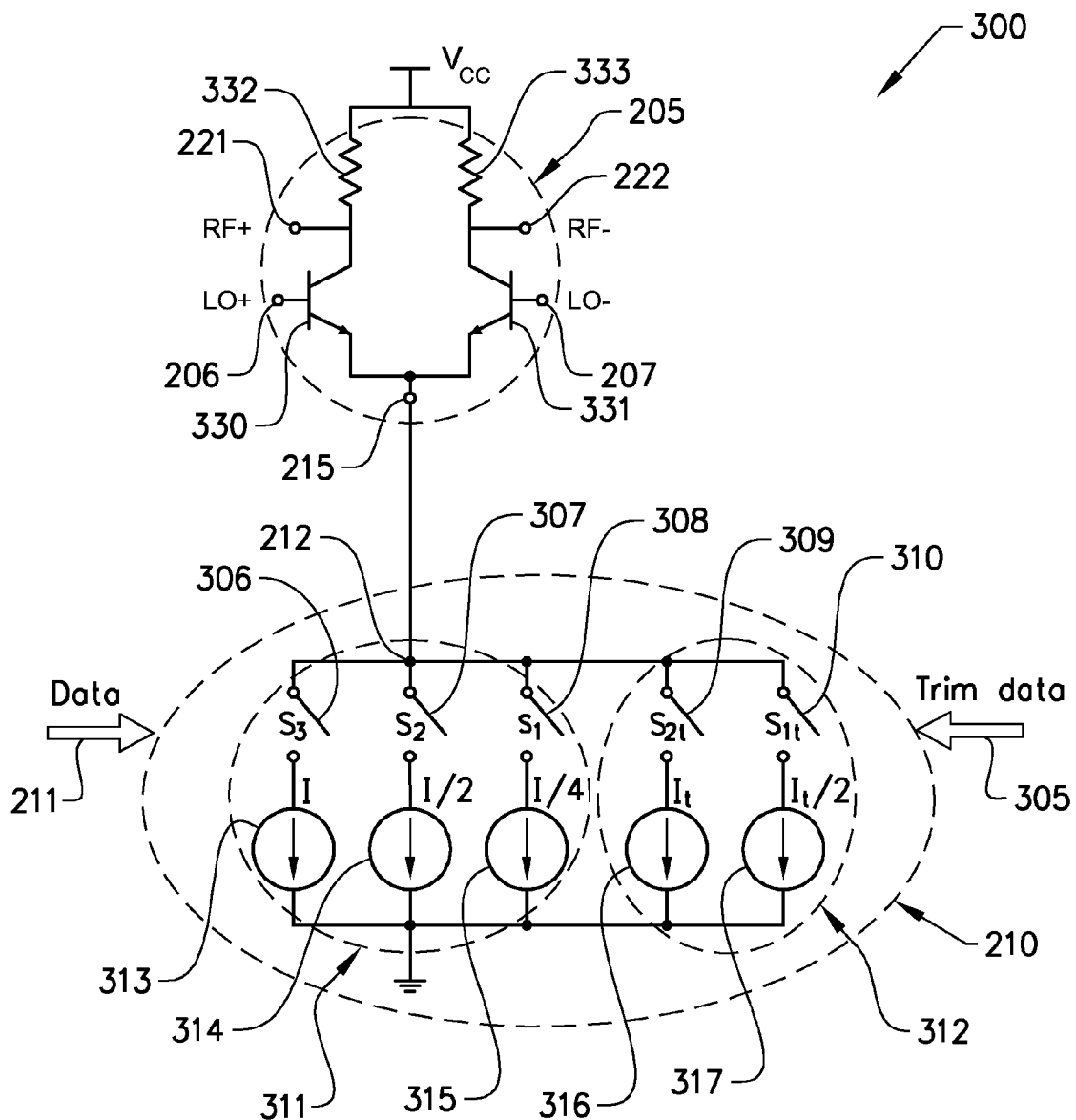
FIG. 3 shows a more detailed first embodiment of the invention.

FIG. 3 shows an example of a detailed embodiment 300 of the mixer circuit 200 from FIG. 2. Components which are also present in FIG. 2 have retained their reference numbers from FIG. 2.

As shown in FIG. 3, the mixing stage 205 comprises an emitter coupled pair of bipolar junction transistors indicated as 330 and 331 in FIG. 2. The base of each transistor is used as one of the differential LO-inputs 206, 207. The collector of each transistor 330, 331, is used as one of the differential outputs 221, 222, for the RF signal which is the resulting output of the mixer circuit 300. The collectors of the transistors 330, 331 are also connected to AC ground via respective resistors 332, 333 which are suitably of the same resistance. The emitters of the transistors 330, 331 are connected at a point which serves as input port 215 to the mixing stage 205. It should be mentioned that the bipolar junction transistors can also be replaced by source coupled FET transistors. How the gate, source and drain of such FET transistors should be connected will however not be described in detail here.

Turning now to the embodiment of a non-linear DAC 210 which is comprised in the mixing circuit 300, the non linear DAC 210 comprises a number of switches 306-310, each of which is coupled in series with a current source 313-317. The "pairs" of switches and current sources are divided into two groups, numbered as 311 and 312 in FIG. 3. The reason for this grouping or division will be explained below. However, with reference to FIG. 4, an example will first be given of an embodiment 400 of a current source for use as the current sources 313-317.

Figure 4:
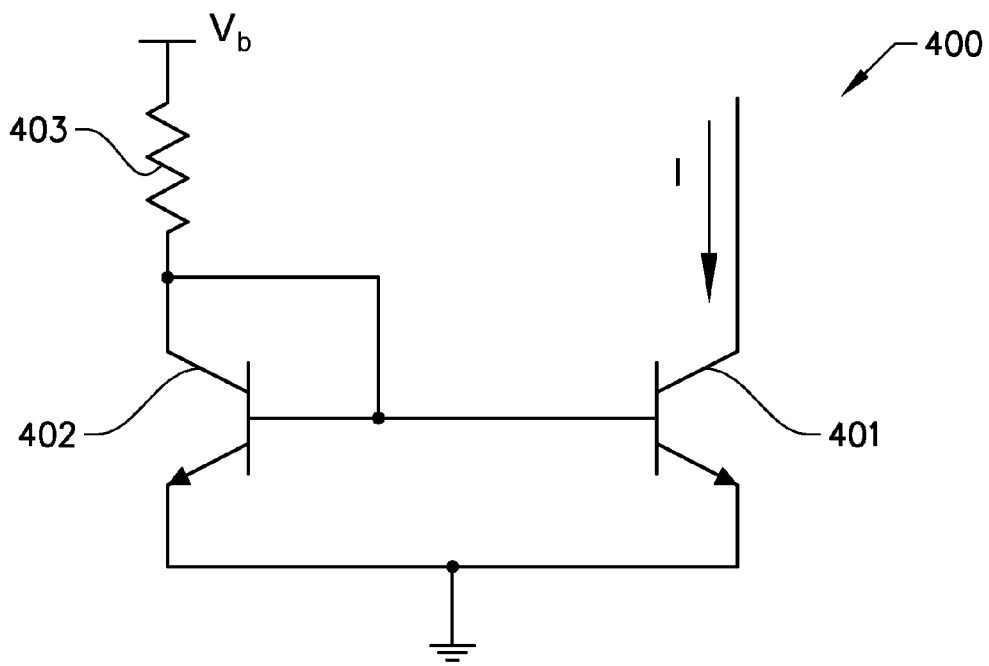
FIG. 4 shows a current source.

FIG. 4 shows an embodiment 400 of a so called current mirror circuit, which comprises two emitter and base-coupled bipolar junction transistors 401, 402. The collector of one of the transistors, in FIG. 4 transistor 401, is used as output port for an output current shown as I in FIG. 4. The collector of the other transistor, i.e. transistor 402, is connected with a bias voltage $V_b$ via a resistor 403. The collector of transistor 402 is also connected to the base of the transistor 402. The amplitude of the current I is determined by means of the bias voltage $V_b$, resistor 403, and the size of the transistors 401 and 402.

The function of the nonlinear DAC 210 of FIG. 3 will now be explained in more detail with reference to FIG. 5, which shows an enlargement of the non-linear DAC 210. In a linear DAC, the number of pairs of switches and current sources would correspond to the maximum number of input bits which the DAC can handle. However, as opposed to this, the non-linear DAC 210 of FIGS. 3 and 5 comprises two groups of pairs of switches and current sources, i.e. the first group 311 and the second group 312. The first group 311 comprises a number of pairs of current sources and switches which corresponds to the maximum number of bits which the DAC 210 is designed to handle, and the second group 312 comprises a number of pairs of current sources and switches which are used to introduce a non-linearity in the function of the DAC 210. Thus, the first group 311 of switches and current sources can also be seen as a DAC with a linear transfer function, and the second group 312 of switches and current sources can be seen as a "non-linearity" component in the DAC 210.

The group 312 is used to see to it that each combination of input bits to the group 311 has its combination of "trim data". An example of such combinations of input data and trim data is shown in the table of FIG. 6. It should be pointed out here that the number of pairs of switches and current sources in each of the groups 311, 312 can naturally be varied more or less arbitrarily, so that the amounts shown in FIGS. 3 and 5, i.e. three pairs in the first group 311 and two pairs in the second group 312 are only examples of a principle used to obtain a DAC with a non-linear transfer function.

Turning now to FIG. 6, there is shown a table of input digital data to the first group 311 and corresponding "trim data" to the second group 312 for each combination of input digital data to the first group 311.

FIG. 7 shows the transfer function of the DAC 210 (solid line), and also shows the transfer function of a linear DAC (dashed line) as comparison. The linear DAC used to obtain this transfer function is the one which is obtained by using only the first group 311 of switches and current sources.

FIG. 7 thus shows the value of the output current I of the DAC 210 as a function of the input data to the first group of switches and current sources 311 and the trim data to the second group 312 of switches and current sources. It should be pointed out that the "trim data" can of course be varied depending on the non-linearity which it is desired to obtain in the DAC 210.

Figure 5:
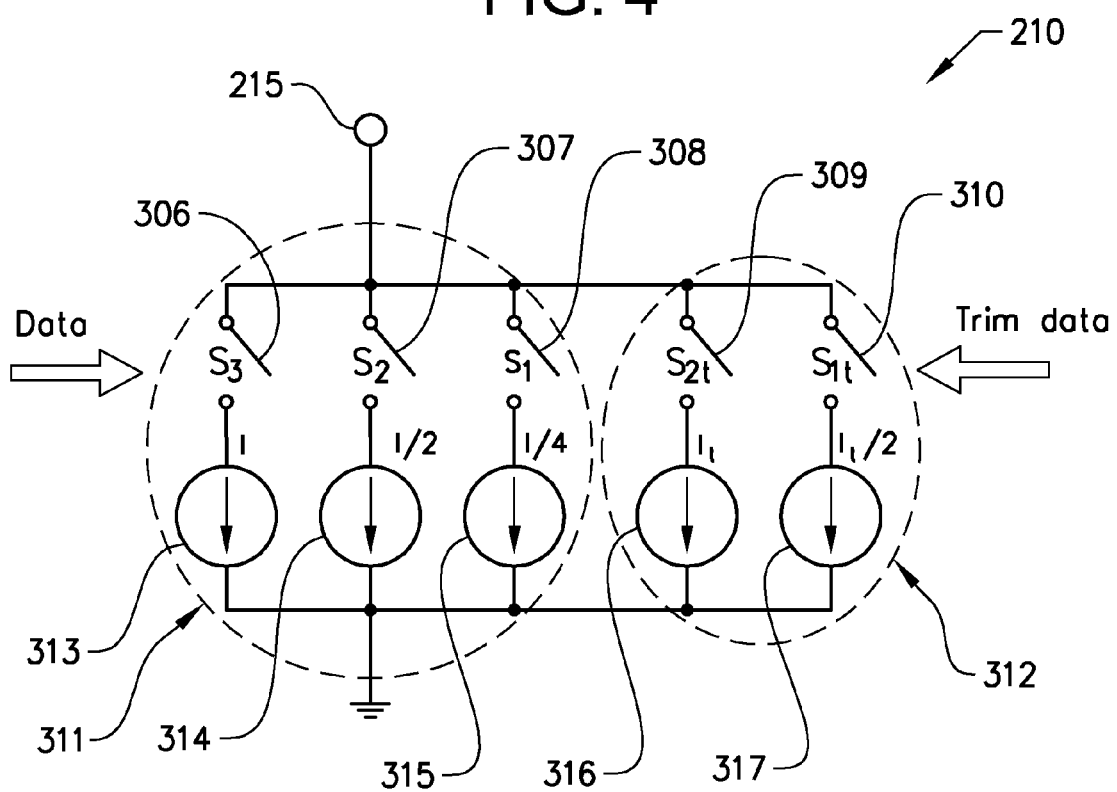
FIG. 5 shows an example of a digital to analogue converter with a non-linear transfer function.
Figures 6, 7:
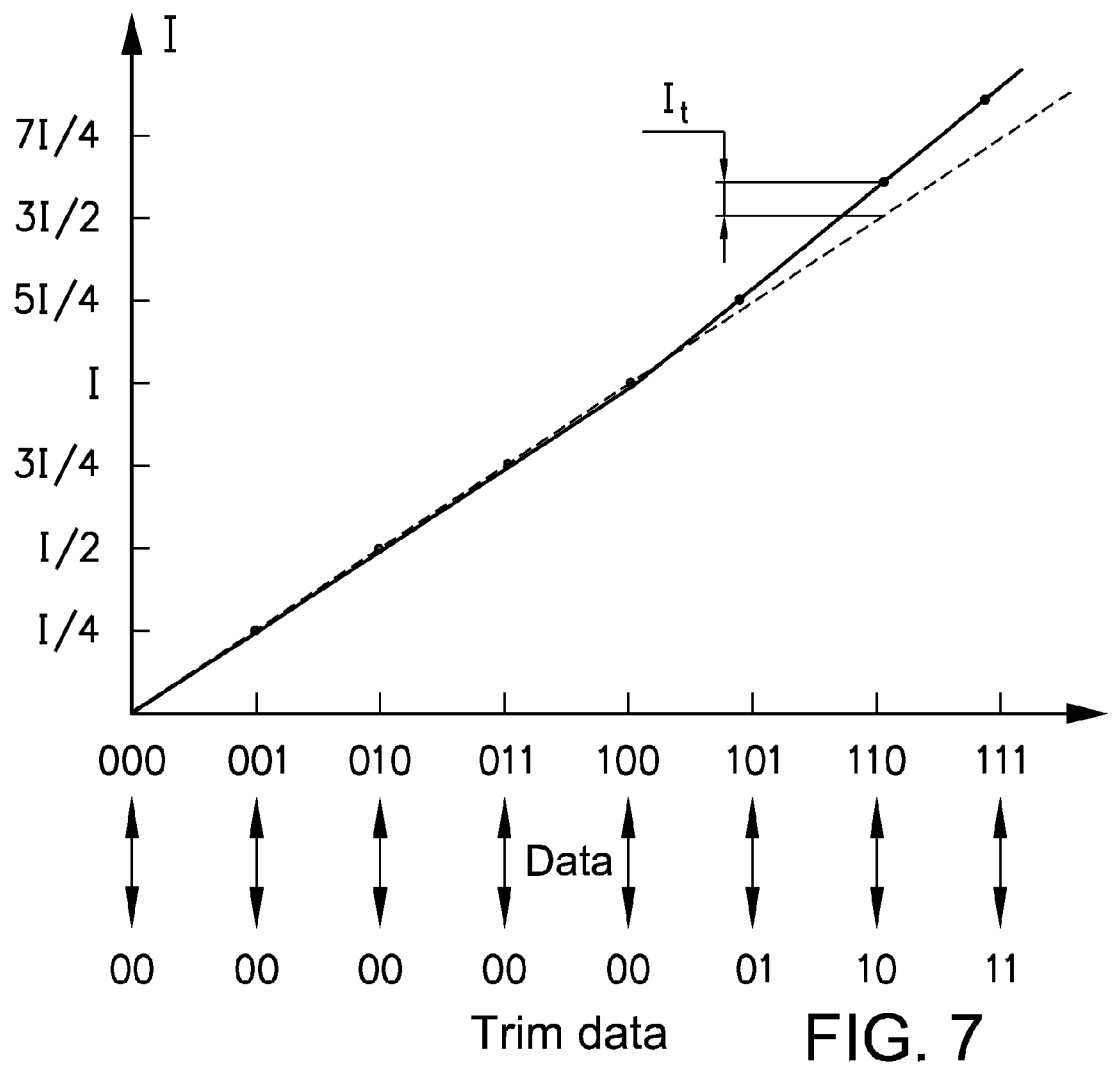
FIG. 6 shows a table of input data and trim data to the digital to analogue converter of FIG. 5.
FIG. 7 shows the transfer function of the digital to analogue converter of FIG. 5.

Thus, the nonlinear DAC 210, as shown in FIG. 5, has two current sources 316, 317, which are controlled by 2 bits trim data, which are used to control the position (open/closed, i.e. 1/0) of the respective switch 309, 310 of the current sources 316, 317. In addition, the two current sources 316, 317 have current values indicated in FIGS. 5 and 7 as of $I_t/2$ and $I_t$. The current values as well as the "trim bits" determine the non-linear transfer function of the DAC 210. As shown in FIG. 4, the current values are determined by the bias voltages $V_b$. In conclusion, the non-linear transfer function of the DAC 210 is determined by the trim bits and the bias voltages of each of the current sources in the second group 312 of switches and current sources.

The non-linear transfer function which I is desired to give the DAC 210 is determined by, for example, a calibration process, following which a table, like the one in FIG. 6, is formed. The "predistortion algorithm" of the mixer circuit of the invention is thus greatly simplified as compared to prior art: for a given input digital data, trim data is generated by a "look up table" such as the one in FIG. 6. The look up table may need to be updated due to, for example, changes in ambient temperature, which thus gives the mixer circuit of the invention an additional function, i.e. temperature compensation.

Regarding the exact nature of the switches 306-310 of the non-linear DAC 210, these can be chosen among variety of components such as, for example, transistors, either bipolar junction transistors or FET transistors or more "traditional" ON/OFF-switches, such as relays.

It should also be pointed out that the examples of non-linear DACs given here is non-exclusive, so that, in other words, other embodiments of non-linear DACs are also possible to use in the invention.

Figure 8:
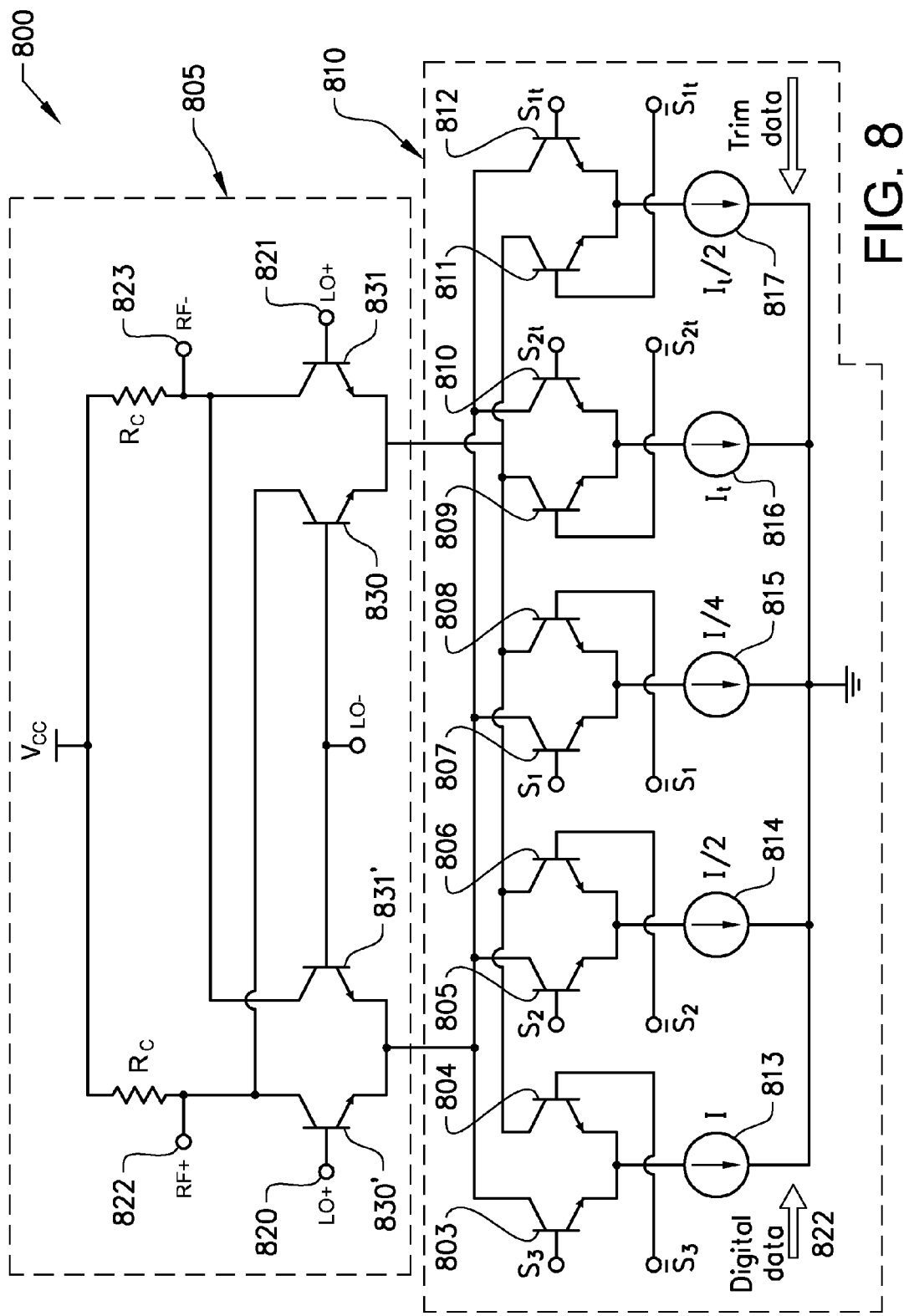
FIG. 8 shows a second embodiment of the invention.

In order to obtain a greater degree of cancellation of LO signal leakage at the RF (output) port or ports, as well as a reduced RF signal leakage at the LO port or ports, a double balanced topology is also proposed herein, as shown in FIG. 8. Due to the similarity between the design 800 shown in FIG. 8 and the design 300 of the mixer circuit shown in FIG. 3, the mixer circuit 800 will not be described in great detail here. However, as shown in FIG. 8, the mixer circuit 800 comprises a mixing stage 805 and a non-linear DAC 810. The mixing stage 805 comprises two input ports 820, 821, for an LO signal, and differential output ports 822, 823 for a mixed signal, i.e. here an RF signal. The mixing stage comprises two pairs of emitter coupled bipolar junction transistors 830, 831 and 830', 831'. The emitter of transistor 830' is connected to the emitter of transistor 830, as is the emitter of transistor 831 to the emitter of transistor 831'.

The base of transistor 831' is connected to the base of transistor 830, and these bases are used as the input for a differential LO signal, i.e. a 180 degree phase shifted LO signal.

In the non-linear DAC 810, the switches are realized as emitter coupled pairs of bipolar junction transistors 803-804, 805-806, 807-808, 809-810, 811-812.

In each such pair of transistors, one transistor is controlled by a bit of binary digital data and the other transistor is controlled by the inverse of said bit, as indicated in FIG. 8 by means of input signals S3, $\overline{S3}$, etc.

The embodiments of mixer circuits described above have been devoted to achieving a DAC which has a non-linear transfer function with respect to the amplitude of the input and output signals. If it is desired to correct for a component which has a non-linear transfer function with respect to both the phase of the input and output signals, the embodiments of mixer circuits described above and shown in the drawings can also be used. This is, for example, useful in a transmitter where the mixer circuit is to be connected to a power amplifier whose phase varies with the power level of the input signal, and which also has a non-linear transfer function with respect to the phase of the input and output signals. Such a "phase and amplitude correcting" transmitter 900 is shown in FIG. 9.

Figure 9:
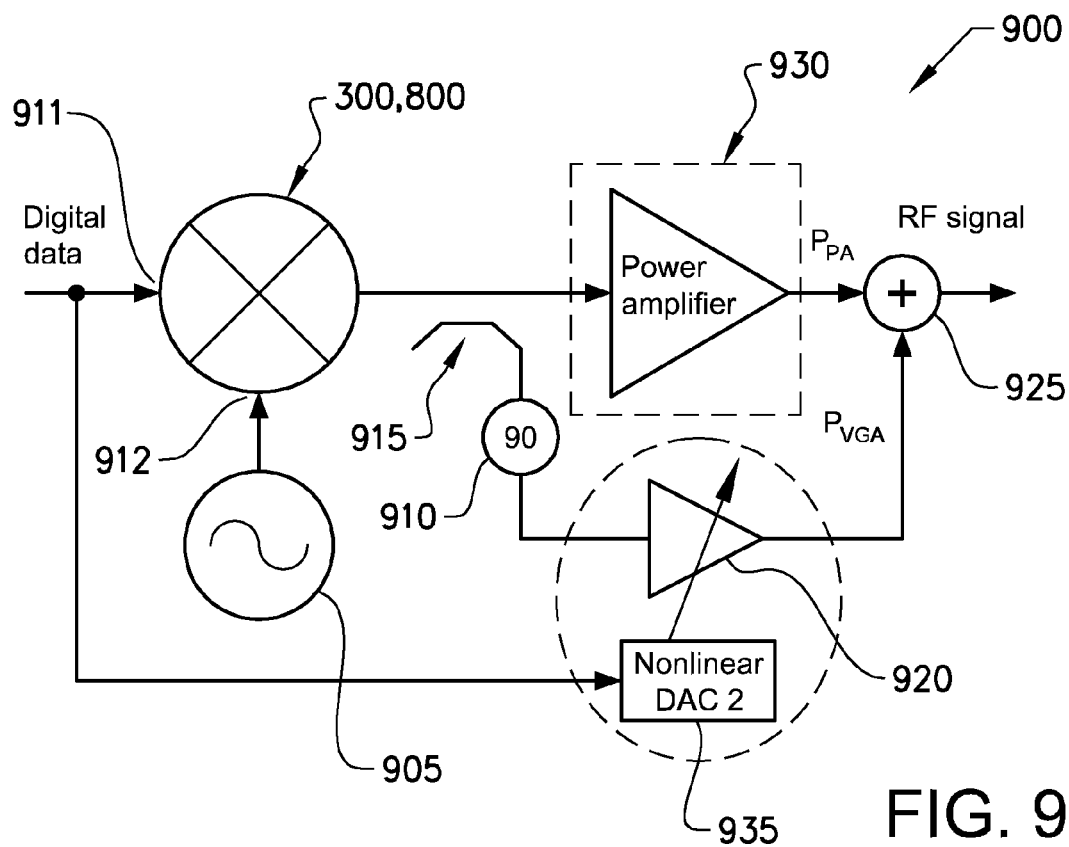
FIG. 9 shows a transmitter with the mixer circuit of FIG. 3 or 8.

The transmitter 900 comprises a mixer circuit such as the one 300 from FIG. 3 or the one 800 from FIG. 8, and receives a first input signal from a Local Oscillator 905 at an input port 912, which is a differential input port, although not explicitly shown as such in FIG. 9. In addition, the mixer circuit 300 also receives digital input data at an input port 911. The output signals from the mixer circuit 300 are used as input signals to the power amplifier 930.

In addition, the transmitter 900 also comprises a directional coupler 915, by means of which a portion of the output signal from the mixer circuit 300 is diverted to 90° phase shifter 910. The output from the phase shifter 910 is used as input to a Variable Gain Amplifier, VGA 920. The gain of the VGA 920 is controlled by the amplitude of the same digital input data as is received by the mixer circuit 300 via a second DAC 935 with a non-linear transfer function.

The output of the VGA 920 is fed to an adder 925, where it is added to the output signals $P_{PA}$ from the power amplifier 930, to become the output signal of transmitter 900.

Figure 10:
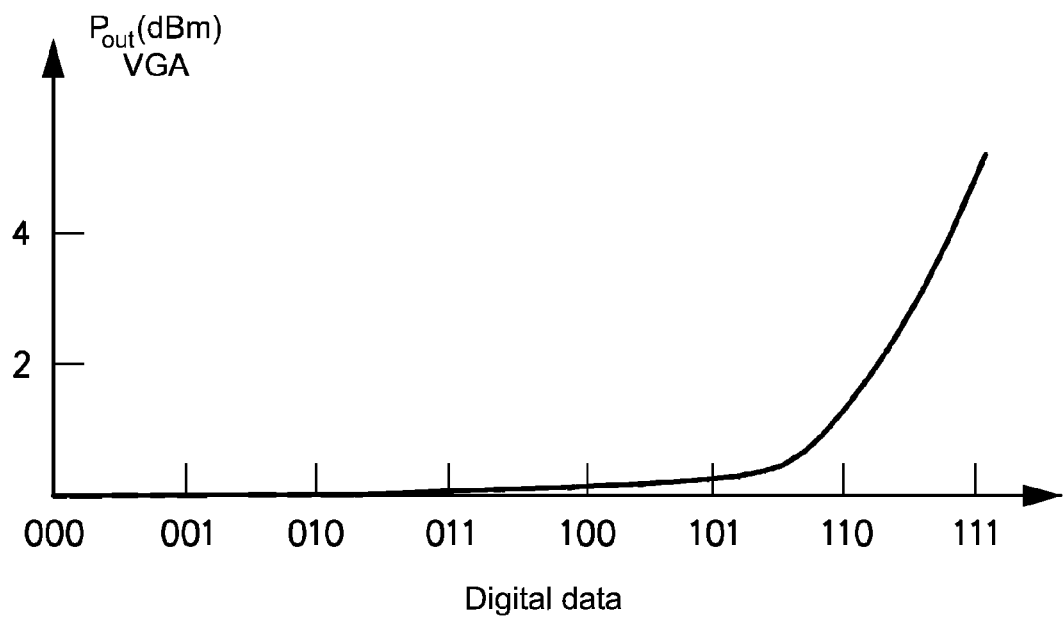
FIG. 10 shows a characteristic of a VGA for use in the transmitter of FIG. 9.

The characteristics of a preferred VGA 920 is shown in FIG. 10, as the output power, $P_{out}$, as a function of digital input data: In order to correct the power amplifier's 930 phase distortion, the output of the VGA 920, indicated as $P_{VGA}$ in FIG. 10, will have a "bend" as shown in FIG. 10: as the input power to the VGA 920 is small, $P_{VGA}$ is around zero, which means that no "correction" will occur. However, as the input power exceeds a certain value, $P_{VGA}$ starts to increase. In those cases, the sum of $P_{VGA}$ and $P_{PA}$, i.e. the output from the adder 925, will obtain an extra phase shift which will counteract the phase distortion of the power amplifier 930. Also, the amplitude of the output signal from the adder 925 may vary with $P_{VGA}$, a variation that is suitably cancelled by the amplitude predistortion shown and described in connection with FIGS. 2-8.

Figure 11:
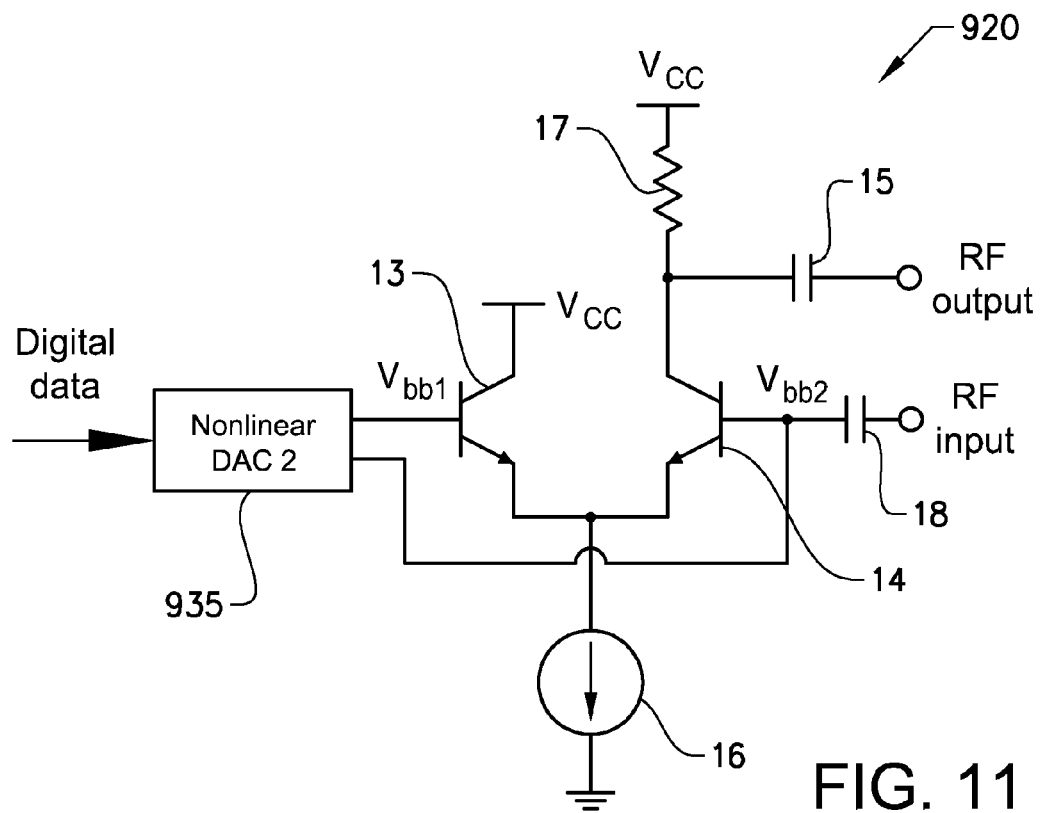
FIG. 11 shows a VGA for use in the transmitter of FIG. 9.
Figure 12:
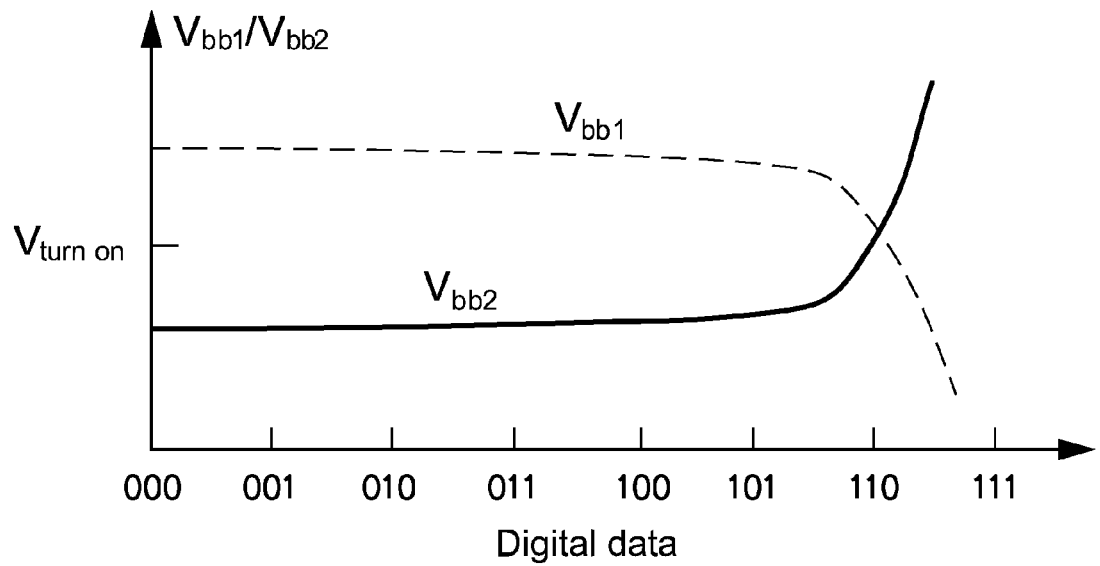
FIG. 12 shows a characteristic of a second DAC.

FIG. 11 shows an embodiment of the VGA 920 of FIG. 10. The second DAC 935 with a non-linear transfer function. As shown in FIG. 11, the VGA 920 comprises two emitter coupled bipolar junction transistors 13, 14, which via their coupled emitters are connected to a current source 16. The VGA has two bias voltages, $V_{bb1}$ and $V_{bb2}$, at the base of each of the transistors 13, 14. The outputs from the second (non-linear) DAC 935 are connected to serve as these bias voltages, $V_{bb1}$ and $V_{bb2}$, at the base of each of the transistors 13, 14, as shown in FIG. 12, in which $V_{turn\ on}$ is each transistor's "turn-on voltage". As the base bias is larger than $V_{turn\ on}$, the transistor's collector starts to work as an amplifier, and when the VGA's output power is around zero, $V_{bb2}$ is biased below $V_{turn\ on}$ and $V_{bb1}$ is biased above $V_{turn\ on}$. Otherwise, $V_{bb2}$ and $V_{bb1}$ are biased in the opposite manner.

The input digital data and the trim data to the second (non-linear) DAC 935 is used to generate the desired bias voltages to the transistors 13, 14, thus controlling the output power of the VGA. Each transistor 13, 14, also has a bias voltage $V_{CC}$ at its collector, in the case of the transistor 14 via a resistor 17. The RF input signal, i.e. the signal from the phase shifter 910 in FIG. 9 is connected to the base of transistor 14, together with the output of the (nonlinear) DAC 935, although the RF input signal is connected via a capacitor 16.

In the drawings and specification, there have been disclosed exemplary embodiments of the invention. However, many variations and modifications can be made to these embodiments without substantially departing from the principles of the present invention. Accordingly, although specific terms are employed, they are used in a generic and descriptive sense only and not for purposes of limitation.

The invention is not limited to the examples of embodiments described above and shown in the drawings, but may be freely varied within the scope of the appended claims.

The invention claimed is:

1. A mixer circuit for mixing a first input signal at a first frequency with a second input signal at a second frequency, wherein said first input signal and said second input signal comprise digital input data, to an output signal at a third frequency, the mixer circuit comprising:
   a mixing stage with differential input ports for the first input signal, an input port for the second input signal, and differential output ports for the output signal, wherein said differential output ports also serve as output ports for the mixer circuit; and
   a digital to analog converter including an input port, which is the input port for the second input signal, and an output port, which is connected to the input port of the mixing stage, wherein the digital to analog converter has a nonlinear transfer function which compensates for non-linearities in the mixing stage.

2. The mixer circuit of claim 1, wherein the digital to analogue converter comprises a first and a second group of pairs of serially coupled switches and current sources, wherein the number of such pairs in the first group corresponds to the number of digital bits in the second input signal, and wherein each switch in the first group is controlled by one of the digital bits in the second input signal, with the switches in the second group being controlled to introduce the nonlinear transfer function in the analog to digital converter.

3. The mixer circuit of claim 2, wherein the switches comprise bipolar junction transistors.

4. The mixer circuit of claim 2, wherein the switches comprise Field Effect Transistors.

5. The mixer circuit of claim 1, wherein the digital to analog converter comprises a first and a second group of emitter coupled pairs of bipolar junction transistors, each serially connected to a current source via their emitters, wherein the number of such pairs in the first group corresponds to the number of digital bits in the second input signal, with the base of one of each transistor in the pairs in the first group being controlled by one of the digital bits ($S_3$-$S_1$) in the second input signal and the base of the other transistor in the pair being controlled by the inverse of the same digital bit ($\overline{S}_3$-$\overline{S}_1$), and the bases of the transistors in the pairs in the second group are controlled respectively by the inverse ($\overline{S}_{2r}$-$\overline{S}_{1r}$) and non-inverse ($S_{2r}$-$S_{1r}$) of one of the digital bits in the second input signal, with the transistors in the second group being controlled to introduce the nonlinear transfer function in the analog to digital converter.

6. The mixer circuit of claim 1, wherein the digital to analog converter comprises a first and a second group of emitter coupled pairs of bipolar junction transistors, each serially connected to a current source via their emitters, and wherein the number of such pairs in the first group corresponds to the number of digital bits in the second input signal, with the base of one of each transistor in the pairs in the first group being controlled by one of the digital bits ($S_3$-$S_1$) in the second input signal and the base of the other transistor in the pair being controlled by the inverse of the same digital bit.

7. The mixer circuit of claim 1, wherein the digital to analogue converter comprises a first and a second group of pairs of serially coupled switches and current sources, and wherein each switch in the first group is controlled by one of digital bits in the second input signal, with the switches in the second group being controlled to introduce the nonlinear transfer function in the analog to digital converter.

8. A transmitter comprising:
   a mixer circuit for mixing a first input signal at a first frequency with a second input signal at a second frequency, wherein said first input signal and said second input signal comprise digital input data, to an output signal at a third frequency, the mixer circuit comprising:
      a mixing stage with differential input ports for the first input signal, an input port for the second input signal, and differential output ports for the output signal, wherein said differential output ports also serve as output ports for the mixer circuit; and
      a digital to analog converter including an input port, which is the input port for the second input signal, and an output port, which is connected to the input port of the mixing stage, wherein the digital to analog converter has a nonlinear transfer function which compensates for non-linearities in the mixing stage;
   a Power Amplifier arranged to receive as its input signal the output signal from the mixer circuit;
   a second digital to analog converter with a non-linear transfer function arranged to receive the second signal as its input data;
   a Variable Gain Amplifier arranged so that its control signal is the output signal from the second digital to analog converter;
   a directional coupler arranged to divert a portion of the output signal from the mixer circuit via a 90° phase shifter which is also comprised in the transmitter as the input signal to the Variable Gain Amplifier; and
   an adder arranged to add the output signals from the Variable Gain Amplifier and the Power Amplifier.

* * * * *